United States Patent [19]

Delhaye et al.

[11] Patent Number: 5,039,958
[45] Date of Patent: Aug. 13, 1991

[54] INTEGRATED SEMICONDUCTOR DEVICE INCLUDING AN INSULATED-GATE FIELD EFFECT TRANSISTOR BIASED TO A CONSTANT LEVEL IN ORDER TO PRODUCE A NEGATIVE DIFFERENTIAL DRAIN CONDUCTANCE ZONE

[75] Inventors: Etienne Delhaye, Nandy; Michel Wolny, Grigny; Thierry Aguila, Fontenay-sous-Bois; Ramesh Pyndiah, Valenton, all of France

[73] Assignee: U. S. Philips Corporation, New York, N.Y.

[21] Appl. No.: 467,628

[22] Filed: Jan. 19, 1990

[30] Foreign Application Priority Data

Jan. 24, 1989 [FR] France .................................. 89 00811

[51] Int. Cl.$^5$ ............................................... H03B 5/00
[52] U.S. Cl. .................... 331/117 FE; 357/22
[58] Field of Search ...................... 357/16, 22 A, 23.2; 331/117 FE

[56] References Cited

PUBLICATIONS

M. Au-Ron et al., FET Logic Device, IBM Technical Disclosure Bulletin, vol. 24, No. 1A, Jun. 1981, pp. 82–84.

Primary Examiner—Robert J. Pascal

[57] ABSTRACT

An integrated semiconductor device, including an insulated-gate field effect transistor biased to a constant level in order to obtain for the transistor an N-shaped drain-source current characteristic as a function of the drain-source voltage so that it presents a negative differential conductance zone, characterized in that it comprises means for applying, between the drain and the source of the field effect transistor, a voltage whose value is in the range of values the drain-source voltage corresponding to the negative conductance zone.

17 Claims, 5 Drawing Sheets

INTEGRATED SEMICONDUCTOR DEVICE INCLUDING AN INSULATED-GATE FIELD EFFECT TRANSISTOR BIASED TO A CONSTANT LEVEL IN ORDER TO PRODUCE A NEGATIVE DIFFERENTIAL DRAIN CONDUCTANCE ZONE

FIELD OF THE INVENTION

The invention relates to an integrated semiconductor device, including an insulated gate-field effect transistor biased to a constant level in order to obtain for the transistor an N-shaped drain-source current characteristic as a function of the drain-source so that it presents a negative differential conductance zone.

BACKGROUND OF THE INVENTION

The invention is used in digital and analog circuits, for example flipflops, notably for memories or hyperfrequency oscillators.

The invention is used in particular for integrated circuits realised by means of technologies utilising the semiconductor materials of the group III-V.

The properties of an insulated-gate field effect transistor are known, for example from the publication "New Negative Resistance Regime of Heterostructure Insulated Gate Transistor Operation" by Michaël F. SHUR et al in "IEEE Electron Device Letters, Vol. EDL-7, No. 2, February 1986".

This document describes the negative differential drain resistance effect which appears in a field effect transistor comprising an N-type conduction channel with a GaAs-GaAlAs heterostructure and an insulated gate which is constantly biased to a high level.

The structure of this so-called HIGFET transistor comprises a non-intentionally doped GaAs layer having a thickness of 0.5 $\mu$m which is provided on a semi-insulating GaAs substrate, followed by a non-intentionally doped GaAlAs layer which serves as a gate insulating layer and on which a gate contact of WSi is realised. Source and drain regions are defined on either side of the gate by localised implantation of Si ions for the N regions or Mg ions for the P-regions. The ohmic contacts on these regions are formed by Au-Ge-Ni metallisations when the regions are of the N-type. The device is insulated by proton implantation. The gate has a length of 1.3 $\mu$m and a width of 10 $\mu$m.

At a high, fixed value of the gate-source voltage of approximately 3 V, in this device a decrease of the drain-source current occurs when the drain-source voltage changes from 0.8 to 1.25 V. Subsequently, at the same fixed gate-source voltage the drain-source current increases when the drain-source changes varies from 1.25 V to higher values. These variations of the drain-source current as a function of the drain-source voltage at a constant and high gate-source voltage thus lead to the appearance of a negative drain resistance in the saturation regime. This effect is due to a spatial transfer of the carriers in the channel which are collected by the gate. The cited document does not propose any application of this effect.

It is an object of the invention to propose digital or analog circuits which are simpler than the equivalent circuits already known to those skilled in the art.

It is another object of the invention to propose such circuits realised by means of active components which can be realised using technologies which can be readily carried out.

It is another object of the invention to propose such circuits operating at ambient temperature.

Another object of the invention is to propose such circuits whose performance is improved with respect to equivalent circuits known to those skilled in the art.

These objects are achieved by means of a device as described in the preamble, characterized in that it comprises means for applying, across the drain and the source of the insulated-gate field effect transistor, a voltage whose value is in the range of values of the drain-source voltage corresponding to the negative conductance zone.

The advantage of this circuit consists in that it is simple and in that it operates at ambient temperature.

SUMMARY OF THE INVENTION

An embodiment of this device is characterized in that for the formation of a flipflop the d.c. gate biasing voltage is fixed, and in that the means for applying the desired voltage between the drain and the source of the insulated-gate field effect transistor consist on the one hand of a direct connection of the source to ground, and on the other hand of a connection of the drain of the field effect transistor, via a resistive load $R_1$, to an input E for a digital signal $V_E$ which supplies pulses on either side of a mean value of the input voltage, the value of the resistive load $R_1$ and the mean value of the input voltage being chosen in the range of values where the circuit formed has two operating points due to the negative differential drain conductance, resulting in a memory effect which is applied to the digital output signal $V_S$ available on the drain S of the field effect transistor.

The advantages of this circuit inter alia consist in that the output signal is more stable than that of known circuits, that the flipflop has actually only two states, and that it has a memory function.

A further embodiment of this device is characterized in that for the formation of an oscillator the means for applying the desired voltage between the drain and the source of the transistor consist on the one hand of a direct connection of the source to ground, and on the other hand of an L-C series circuit which is connected between a d.c. supply $V_{DD}$ and ground, via an end of the inductance L and via an end of the capacitance C, respectively, the common node of the inductance L and the capacitance C being connected to the drain of the field effect transistor on which the output signal S of the oscillator is formed, the value of the d.c. supply voltage $V_{DD}$ being chosen so that the field effect transistor is equivalent to a negative conductance connected to the L-C circuit.

In an alternative version of the latter embodiment the d.c. gate biasing voltage $V_1$ for the gate of the field effect transistor can be adjusted in the range where the transistor has a negative drain conductance zone in order to adjust the output power of the oscillator.

In another alternative version, the capacitance of the L-C circuit may be chosen to be variable as a function of a voltage $V_2$ in order to adjust the operating frequency of the oscillator.

The advantage of these oscillator circuits consists in that they are simple, frequency-controllable, usable at hyperfrequencies, and that they can also have an adjustable output power.

Various transistors known for supplying a negative drain conductance may be used for realising the device in accordance with the invention; generally speaking, any field effect transistor, that is to say a unipolar transistor whose gate is insulated from the conduction channel either by an oxide or by a material forming a heterojunction with the active layer and whose substrate is either semi-insulating or conductive, that is to say made of a doped semiconductor material, is suitable.

BRIEF DESCRIPTION OF THE DRAWINGS

The invention will be described in detail hereinafter, by way of example, with reference to the accompanying diagrammatic drawings; therein.

DETAILED DESCRIPTION OF THE INVENTION

Figure 1:
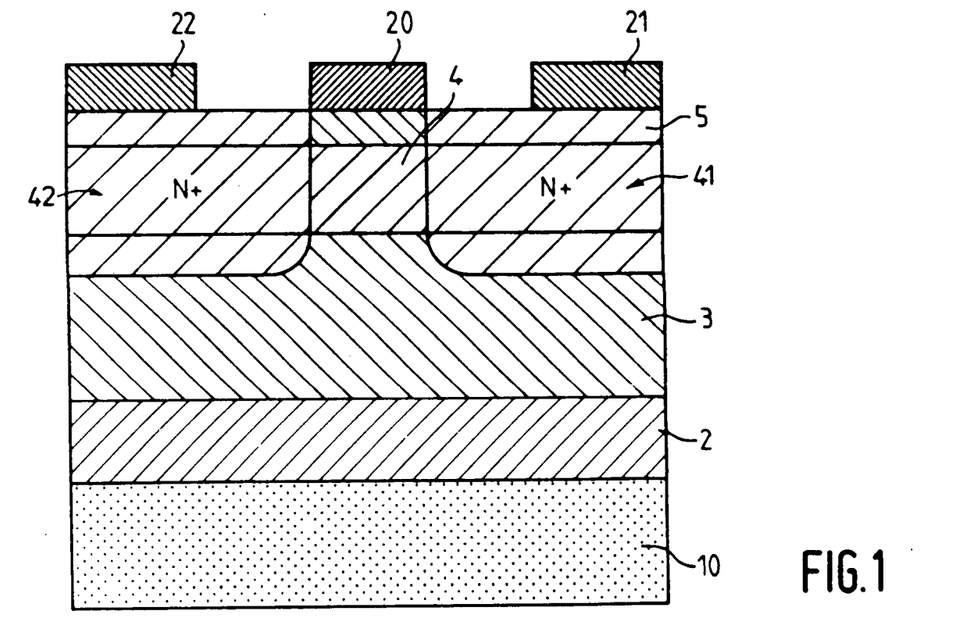
FIG. 1 shows a heterojunction insulated-gate field effect transistor.

FIG. 1 shows a heterojunction insulated-gate field effect transistor having a structure which is suitable for carrying out the invention. It will be described hereinafter that other insulated-gate field effect transistors can also be used.

As appears from FIG. 1 the transistor comprises, realised on a binary substrate 10, a binary buffer layer 2, followed by a heterostructure which is formed by a non-intentionally doped binary layer 3 on which there is provided a non-intentionally doped ternary layer 4. The structure of this transistor also includes an upper, protective layer 5 which is made of a non-intentionally doped binary material.

The binary layers are preferably made of a semiconductor compound of the group III-V, for example gallium arsenide (GaAs), and the ternary layers of a semiconductor compound of the group III-V such as gallium and aluminium arsenide (GaAlAs).

This device also comprises, provided on its upper surface, a gate contact 20 which is made of a metal which is preferably chosen from the refractory metals such as WN or WSi, or a highly doped semiconductor material such as highly doped gallium arsenide.

The device also comprises, on either side of the gate 20, a source electrode 21 and a drain electrode 22 which are formed on highly doped islands 41 and 42 which define the source and drain regions.

A method of realising such a transistor is known notably from the article cited as being the state of the art or from the publication "High Performance WN-Gate MISFETs fabricated from MOVPE Wafers" by M. WOLNY et al in "Electronics Letters, Oct. 8th, 1987, Vol. 23, No. 21, pp. 1127-1128".

The latter document describes a method of realising a transistor which comprises first of all a semi-insulating GaAs substrate which is, covered by a non-intentionally doped GaAlAs buffer layer. This transistor furthermore comprises a heterostructure which is formed by a non-intentionally doped GaAs layer which has a thickness of approximately 0.6 μm which is covered by a non-intentionally doped GaAlAs layer having a thickness of approximately 40 nm. The latter layer is covered by a thin, non-intentionally doped GaAs layer which serves as a protective layer preventing oxidation of the upper layer of the heterostructure. On the surface of the protective layer there is formed a gate contact of a refractory metal WN, on both sides of which N+-type islands define the source and drain regions on which the ohmic source and drain contacts of an Au-Ge-Ni alloy are realised.

This known transistor has the advantage that it has a simple construction and a high performance, which is particularly attractive for carrying out the present invention.

Figure 2A:
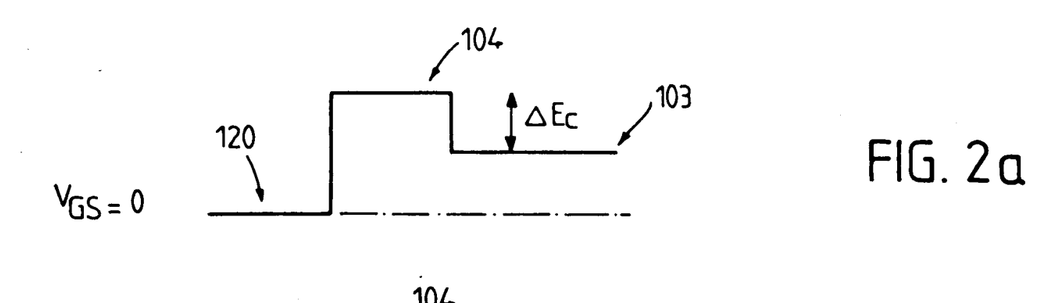
FIGS. 2a to 2c show the energy levels of the lower sides of the conduction bands of the various materials constituting the transistor for different values of the d.c. gate biasing voltage $V_{GS}$.
Figure 2B:
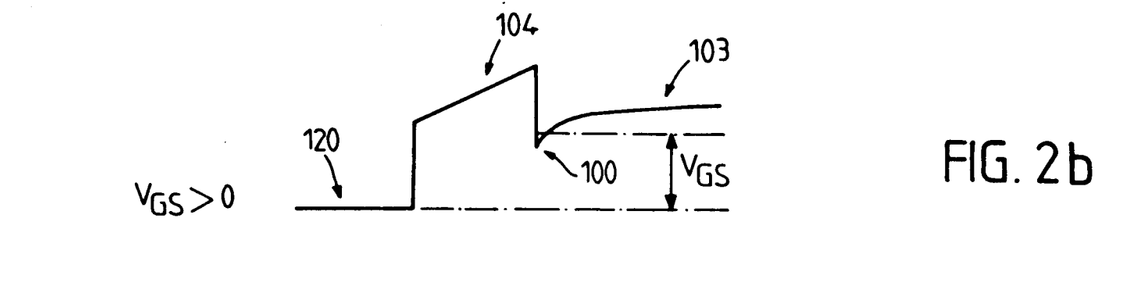
Figure 2C:
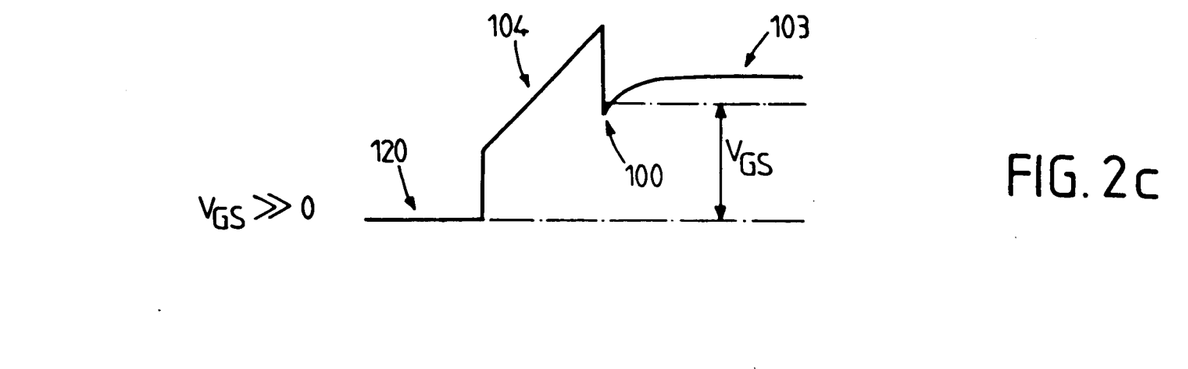

The FIG. 2 show the energy levels of the lower sides of the conduction bands of the various materials constituting the transistors for different values of the d.c. gate biasing voltage $V_{GS}$.

The reference 120 denotes the energy level of the gate metal, the reference 104 that of the ternary material 4, and the reference 103 that of the binary material 3 of the heterojunction. The value $\Delta E_c$ is the energy difference between the lower sides of the conduction bands of the materials 3 and 4 constituting the heterojunction.

FIG. 2a shows the energy levels for each of the transistor materials for $V_{GS}=0$. Initially, when the gate biasing voltage $V_{GS}=0$, the Fermi level is in line with that of the metal.

FIG. 2b shows these energy levels when the gate biasing voltage $V_{GS}$ is higher than 0. This Figure shows that the conduction bands are deformed and that a potential well is formed at the point 100. At the point 100 a bidimensional electron gas accumulates.

FIG. 2c shows the same bands when the gate biasing voltage $V_{GS}$ becomes very much higher than 0. These bands are then deformed so that the entire voltage is actually present on the terminals of the ternay layer, because the potential of the point 100 does not evolve or evolves only very little. Actually, the bidimensional electron gas is entered below the Fermi level. Consequently, the apparent thickness of the ternary layer 4 decreases and a tunnel effect occurs which is added to the thermionic emission at the interface of the two layers 3 and 4 constituting the heterojunction.

Figure 3A:
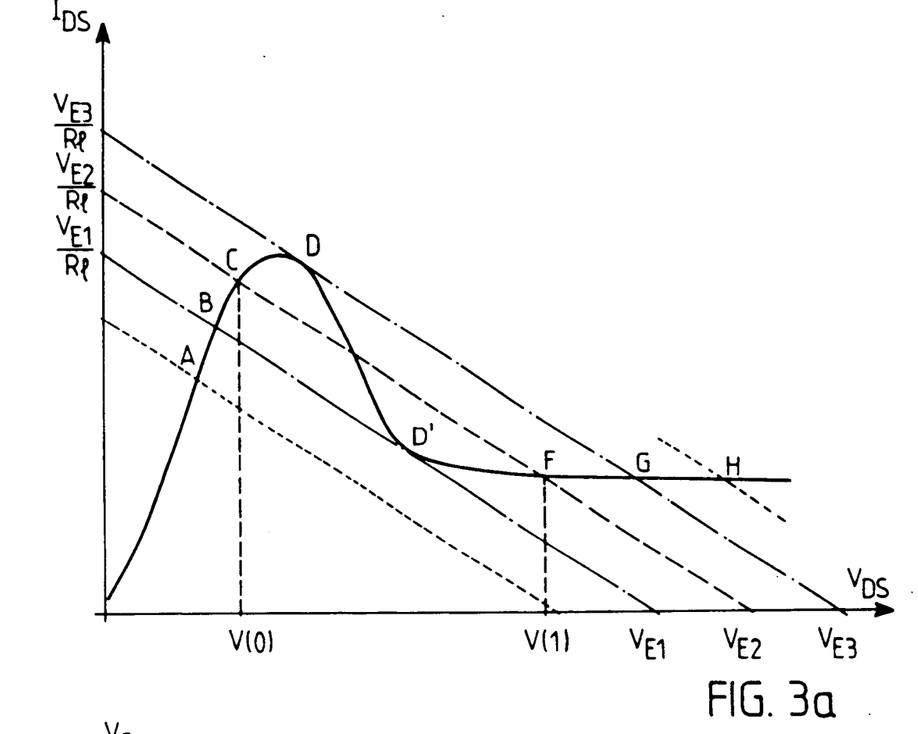
FIG. 3a shows the characteristic $I_{DS}$ as a function of $V_{DS}$ for a constant and high $V_{GS}$.

As soon as the bidimensional electron gas exists and a drain-source voltage is applied, accelerated carriers become energetic, can overcome the energy barrier $\Delta E_c$ and are collected by the gate. Thus, when the gate is strongly biased by a forward supply voltage $V_{GS}$, the drain current decreases, because when $V_{DS}$ is increased, the apparent barrier for the electrons is lowered and the probability that these electrons overcome the barrier increases strongly. All electrons which escape from the bidimensional electron gas no longer participate in the drain current $I_{DS}$ which, therefore, decreases. Thus, a saturation drain-source current characteristic as a function of the drain-source voltage $V_{DS}$ is obtained as shown in FIG. 3a. It is important to note that this characteristic has a shape which is referred to as an N-shape.

In the FIG. 3a the zone where the current decreases beyond the maximum D corresponds to a negative differential resistance region between the drain and the source.

The transistor $T_1$ described above can be biased in circumstances which are favourable for obtaining this negative differential resistance region.

Two examples of embodiments of the biasing means for applying, between the drain and the source of insulated-gate field effect transistors, a voltage whose value is in the range of values of the drain-source voltage which corresponds to the negative conductance zone; these two examples refer to circuits having different functions.

EXAMPLE I

Referring to the FIGS. 3a, 3b, 4a and 4b, a description will be given of the biasing means of an insulated gate field effect transistor in order to obtain a digital output signal $V_S$ on the basis of a digital input signal $V_E$ which supplies pulses on either side of a mean value.

The circuit in accordance with the invention serves as a bistable flipflop (actually having only two stable states) whose output signal is very stable and has a memory function.

Figure 4A:
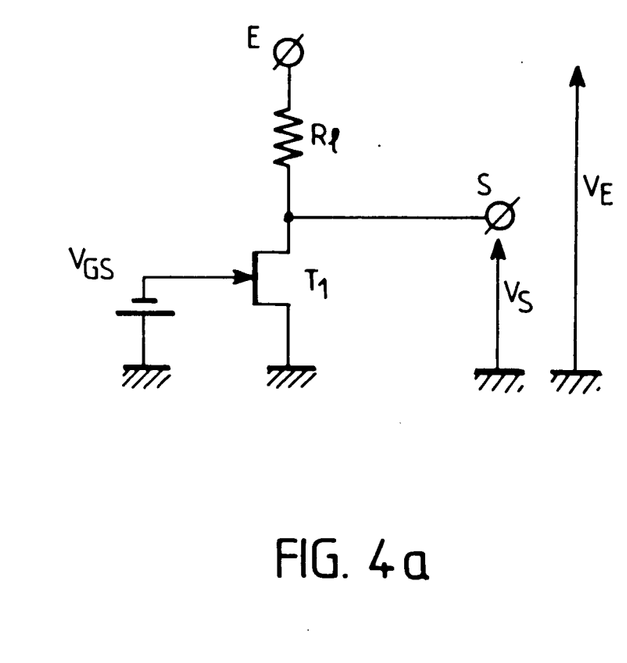
FIG. 4a shows the diagram of the device, including an insulated-gate field effect transistor suitable for forming a flipflop circuit in accordance with the invention.

The circuit suitable for obtaining this effect is diagrammatically shown in FIG. 4a. It comprises a transistor $T_1$ and a resistance $R_1$ which is arranged between the drain of the transistor $T_1$ and the input E for the digital signal $V_E$. The source of the transistor $T_1$ is connected directly to ground. The gate of the transistor $T_1$ is biased by a d.c. voltage $V_{GS}$ which is fixed and sufficiently high to produce the effect illustrated in FIG. 2c and the characteristic shown in FIG. 3a.

The gate voltage $V_{GS}$ being fixed to a value $V_{GS}=V_1$, the value (values) of the output voltage $V_S=V_{DS}$ is (are) determined by the intersection (intersections) between the characteristic $I_{DS}$ as a function of $V_{DS}$ of the transistor and the straight line $V_{DS}=V_E-R_1\cdot I_{DS}$, referred to as the load line. The pair ($V_{DS}$, $I_{DS}$) must satisfy these two relations. These points ($V_{DS}$, $I_{DS}$) are referred to as operating points of the circuit.

When the value of the digital input voltage $V_E$ applied to the end of the resistance R is lower than a value $V_{E1}$ plotted on the axis of the abscissae of FIG. 3a, the operating point of the circuit is situated on the characteristic between the points A and B. The output voltage of the circuit as shown in FIG. 4a is referred to as $V_S$ which is derived between the drain of the transistor $T_1$ and ground. This output voltage $V_S$ must be read on the axis of the abscissae $V_{DS}$ of FIG. 3b.

If the value of the input voltage increases from $V_{E1}$ to $V_{E3}$, the operating point of the circuit is shifted on the characteristic from B to C, determined by the load lines $$V_{DS}=V_{E1}-R_1 I_{DS}$$

and $$V_{DS}=V_{E2}-R_1 I_{DS},$$

and further to D which is the maximum of the curve corresponding to the load line $$V_{DS}=V_{E3}-R_1 \cdot I_{DS}.$$

Beyond the value $V_{E3}$ the operating point is situated between G and H. The transition from D to G takes place in the vicinity of $V_{E3}$.

Figure 3B:
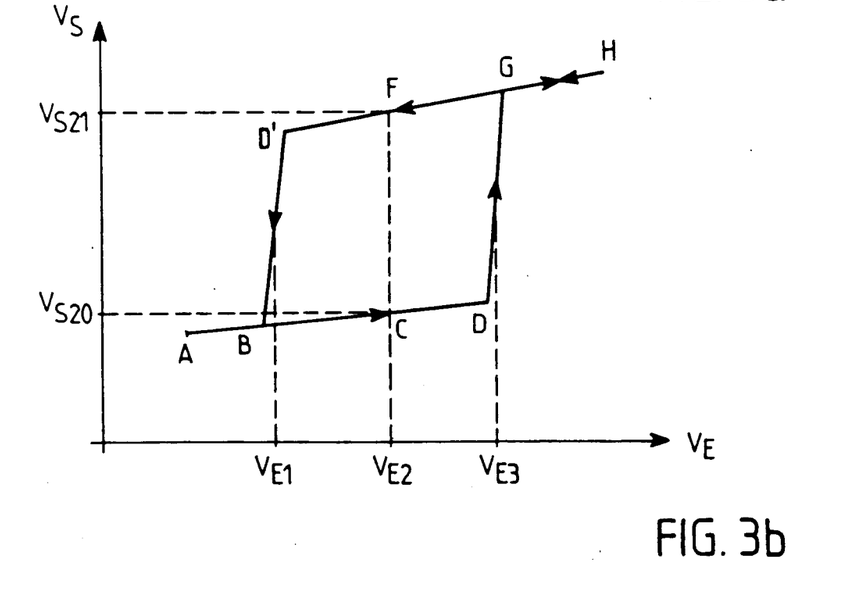
FIG. 3b shows the hysteresis curve due to the two operating points of the circuit.

When the voltage $V_E$ changes from $V_{E3}$ to $V_{E1}$ again, the operating points of the circuit shift from D' to D and subsequently to B and finally to A. On the transfer curve of the circuit ($V_{ES}=F(V_E)$) this is translated as a hysteresis as shown in FIG. 3b. This curve shows that for an input voltage $V_E=V_{E2}$ two operating points exist which are represented by the points C and F in the FIGS. 3a and 3b, one operating point corresponding to a level 1 while the other operating point corresponds to a level 0 for the output of the circuit.

Figure 4B:
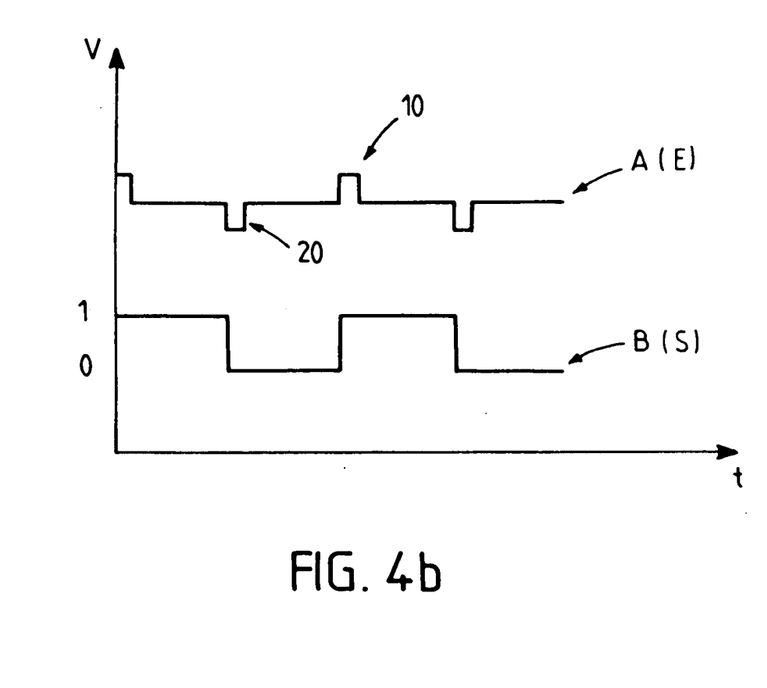
FIG. 4b shows the sequencing of the input signal and the output signal of the flipflop circuit.

Thus, when a digital signal such as the signal represented by the curve A in FIG. 4b is applied to the input E of the circuit shown in FIG. 4a, the waveform obtained on the output S between the drain and ground of the circuit of FIG. 4a will be shaped as the curve B of FIG. 4b.

FIG. 4b shows that 2 stable states $V_{S20}$ (read "$V_S$ two-zero") and $V_{S21}$ (read "$V_S$ two-one") are obtained for the same input level $V_{E2}$. A bistable circuit is thus realised by means of the circuit shown in FIG. 4a with the biasing conditions described above.

A circuit of this kind is used for the realisation of static memory cells for which the writing of a logic "1" is realised by applying a peak as denoted by the reference numeral 10 on the curve A of FIG. 4b, and the writing of a 0 is realised by applying a peak as denoted by the reference numeral 20 on the curve A of FIG. 4b.

For each edge of the peaks 10, 20 or pulses around the mean value $V_{E2}$ of the voltage $V_E$, the output voltage $V_S$ changes its state from the level 1 to the level 0 or vice versa, but when the input signal assumes the mean value $V_{E2}$ again, the output signal $V_S$ saves the information until the application of a new peak or pulse 10, 20. The circuit in accordance with the invention thus acts as a bistable flipflop having a memory function.

The very high stability of the output signal is obtained due to the fact that the resistance $R_1$ is connected to the drain of the field effect transistor, enabling the input signal to be applied to one of its ends and the output signal to be derived from the drain at its other end, the source being connected directly to ground.

In a preferred embodiment where the transistor $T_1$ is of the described type as shown in FIG. 1:
the gate biasing voltage $V_{GS}=2.8$ V
the width W of the gate of the transistor $T_1$ is 10 µm
the load resistance $R_1=1.8$ kΩ
the input voltage $V_E$ is between 3 V and 4 V
the output voltage $V_S$ is between 0.5 V and 2 V.

A memory cell realised using the flipflop in accordance with the invention is particularly attractive because it comprises only a transistor, a resistive load for the flipflop and an access transistor. It operates at ambient temperature with fewer components on average than known from the present state of the art.

EXAMPLE II

Referring to the FIGS. 3a, 5 and 6, hereinafter a description will be given of the biasing means of an insulated-gate transistor in order to obtain, for example, a hyperfrequency oscillator circuit.

Figure 5A:
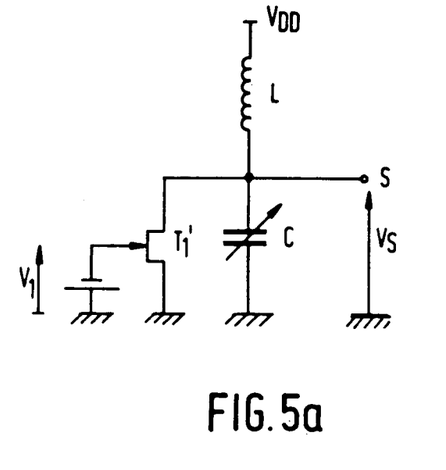
FIG. 5a shows an oscillator circuit in accordance with the invention.

As appears from FIG. 5a, this circuit comprises an insulated-gate field effect transistor $T'_1$ whose gate is biased by a d.c. voltage $V_{GS}=V_1$ which is sufficiently high to produce the effect illustrated by FIG. 2c and the characteristic of FIG. 3a. The source of the transistor $T'_1$ is connected directly to ground.

This circuit also comprises an L-C series circuit which is arranged between a d.c. supply $V_{DD}$, whereto one end of the inductance L is connected, and ground whereto one end of the capacitance C is connected, the common node S of the inductance L and the capacitance C being connected to the drain of the field effect transistor T'$_1$ on which the output signal V$_S$ is available.

The value of the level of the d.c. supply V$_{DD}$ is chosen so that the insulated-gate field effect transistor T'$_1$ is equivalent to a negative conductance g$_d$. The oscillator obtained is thus equivalent to the diagram shown in FIG. 5c where g$_d$<0.

Figure 5B:
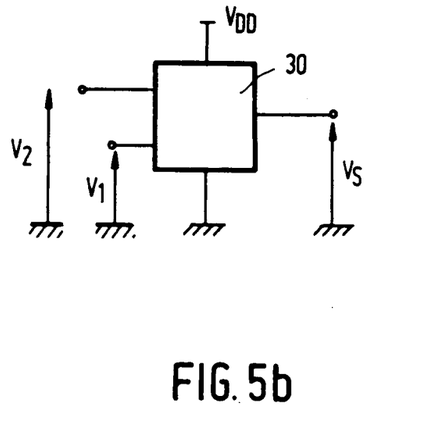
FIGS. 5b and 5c show equivalent diagrams for the oscillator in accordance with the invention.
Figure 5C:
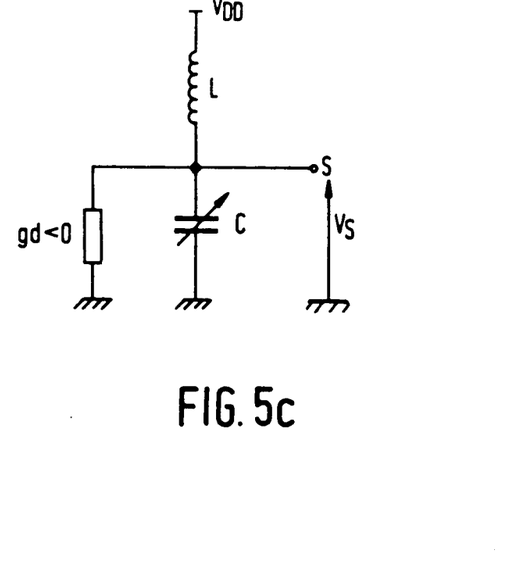

The output power of the oscillator shown in FIG. 5c is a complex and non-linear function of the conductance g$_d$ used. Therefore, the negative conductance g$_d$ itself is a function of the biasing voltage V$_1$ of the gate of the insulated gate field effect transistor in the circuit in accordance with the invention (FIG. 5a) as will appear when the characteristic of FIG. 3a is considered.

Therefore, in the oscillator circuit shown in FIG. 5a the output power of the oscillator can be controlled via the gate biasing voltage V$_1$ which, nevertheless remains in the zone enabling a negative conductance region to be obtained.

On the other hand, the operating frequency of the oscillator shown in the FIGS. 5 depends on the values of the inductance L and the capacitance C. For realising a voltage-controlled oscillator, for the capacitance C use can be made of a capacitance which can be controlled by means of a voltage, for example a varicap which is controllable by means of a d.c. voltage V$_2$. The oscillator 30 thus has the diagram shown in FIG. 5b as its equivalent circuit.

In the present embodiment, in order to obtain a hyperfrequency oscillator operating at the frequency f=20 GHz, the elements can be realised with the following values:

L=0.5 nH
C=0.1 pF
V$_1$=2.1 V
V$_{DD}$=1 V.

The transistor T'$_1$ will have a gate length l=1 μm and a gate width W=10 μm and will be of the described type.

Figure 6:
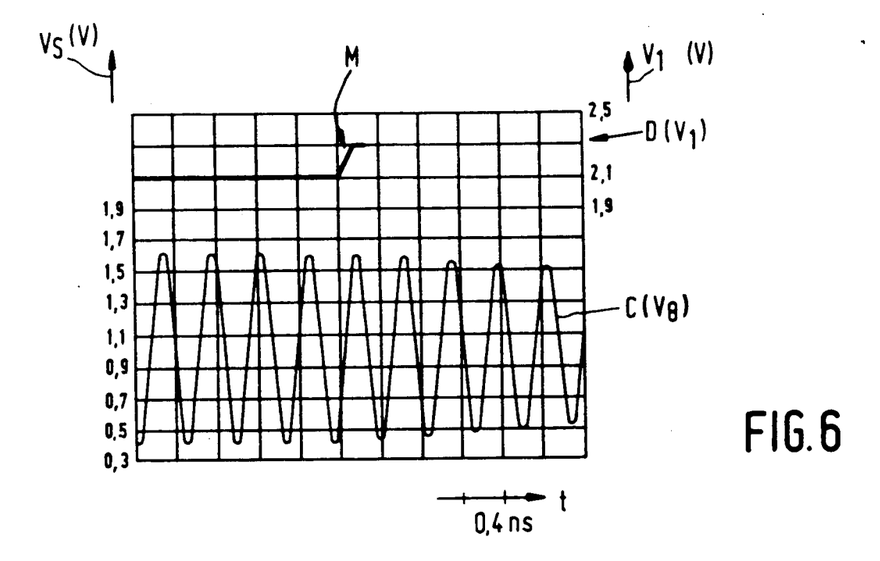
FIG. 6 shows the waveform of a signal obtained by means of an oscillator circuit in accordance with the invention.

FIG. 6 shows that the oscillation at f=20 GHz can be readily obtained with elements L-C which can be readily integrated and with voltages which are compatible with the levels customarily used in integrated circuits.

In FIG. 6 the curve C denotes the output signal V$_S$ derived from the drain of the field effect transistor T$_1$, and the curve D represents the gate biasing voltage V$_1$. Observing the curve D representing V$_1$, it appears first of all that a variation M of V$_1$, corresponding to, for example, an increase, leads to a variation of the output power, which is in this case translated into a decrease of the amplitude of the curve C.

The transistors described in the cited publications are not the only transistors exhibiting a negative drain conductance or resistance effect.

Actually, any transistor of the field effect type (unipolar) comprising an insulated gate may be used for realising circuits in conformity with the examples I and II. Generally speaking, when a high voltage V$_{GS}$ is applied to the gate of one of these transistors, an N-shaped characteristic I$_{DS}$ will be obtained as a function of V$_{DS}$ as shown in FIG. 3a, and the source can be connected to ground and the drain to a voltage (V$_E$ or V$_{DD}$) by means of a biasing circuit (R$_1$ or L-C) so that the circuit obtained operates in the negative conductance region DD' of FIG. 3a.

Examples of insulated-gate field effect transistors which can also be used are:

a) the Metal Oxide Semiconductor Field Effect Transistors (MOSFETs). This type of transistor, generally realised on silicon, has a gate which is metallic and insulated from the active layer by an oxide layer. The negative drain conductance can be obtained because of the fact that the electrons emerging from the active layer traverse the oxide layer under the influence of the tunnel effect and are captured by the gate when the latter is biased to a suitable level V$_1$.

b) The Heterostructure Insulated-Gate Field Effect Transistors (HIGFETs). In this type of transistor, generally realised of materials of the group III-V, the gate is insulated from the active layer by a layer forming a heterostructure with the active layer. In this category there are several sub-groups of transistors which enable the invention to be carried out.

transistors whose substrate is semi-insulating. In this case the negative drain conductance effect occurs because the electrons from the bidimensional electron gas (see above) are captured by the gate;

transistors whose substrate is conductive, for example, made of a doped semiconductor material (for example, N+ doped). In this case the negative drain conductance is realised by the emission of hot electrons towards the conductive substrate and not towards the gate.

In this group of HIGFETs the gate of the field effect transistors can be realised in two different ways. The gate may be metallic for the MISFETs (Metal Insulator Semiconductor Field Effect Transistor) or the gate itself may be made of a semiconductor material for the SISFETs (Semiconductor Insulator Semiconductor Field Effect Transistor).

For the hot electrons, the material constituting the gate is actually indifferent and the effect is not changed.

It will be noted that in the entire foregoing description it has not been stated that the transistors comprising a quantum well are also suitable for carrying out the invention. Such a transistor is known, for example from the application EP 0 225 698. In such a bipolar transistor, for example the quantum well between the base and the emitter has discrete carrier energy levels. By modifying the emitter-base bias, the energy of the well levels can be made equal to that of the lower side of the conduction band of the emitter material. When this method is used, the base-current characteristic as a function of the base-emitter voltage shows a peak, followed by a discontinuity. It has been stated that the proposed circuit enables the realisation of a bistable flipflop or a frequency divider. However, this quantum well transistor is extremely difficult to realise from a technological point of view because of the small thickness of the layers necessary for said quantum well. On the other hand it operates only at a temperature of 77° K. which is a drawback for the intended application: mass products in the field of television. Finally, the existence of the discontinuity due to the discrete energy levels leads to numerous drawbacks, notably instabilities. Moreover, the effect appearing on the base current characteristic as a function of the base-emitter voltage is completely different from the negative drain conductance effect used in the devices in accordance with the invention.

We claim:

1. An integrated semiconductor device, comprising: an insulated-gate field effect transistor having a drain, a source, and a gate;

means for biasing the transistor to a constant high level to obtain an N-shaped drain-source current characteristic as a function of the drain-source voltage so that it presents a negative differential conductance zone; and means for applying, between the drain and the source of the field effect transistor, a voltage whose value is in the range of values of the drain source voltage corresponding to the negative conductance zone.

2. A device as claimed in claim 1, characterized in that for the formation of a flipflop the gate biasing voltage $V_{GS}$ is fixed, and in that the means for applying the desired voltage between the drain and the source of the insulated-gate field effect transistor consist on the one hand of a direct connection of the source to ground, and on the other hand of a connection of the drain of the field effect transistor, via a resistive load $R_1$, to an input E for a digital signal $V_E$ which supplies pulses on either side of a mean value of the voltage, the value of the resistive load $R_1$ and the mean value of the input voltage being chosen in the range of values where the circuit formed has two operating points due to the negative differential drain conductance, resulting in a memory effect which is applied to the digital output signal $V_S$ available on the drain S of the field effect transistor.

3. A device as claimed in claim 1, characterized in that for the formation of an oscillator the means for applying the desired voltage between the drain and the source of the insulated-gate field effect transistor consist on the one hand of the direct connection of the source to ground, and on the other hand of an L-C series circuit which is connected between a d.c. supply $V_{DD}$ and ground, via an end of the inductance L and via an end of the capacitance C, respectively, the common node of the inductance L and the capacitance C being connected to the drain of the field effect transistor on which the output signal S of the oscillator is formed, the value of the d.c. supply voltage $V_{DD}$ being chosen so that the insulated-gate field effect transistor is equivalent to a negative conductance connected to the L-C circuit.

4. A device as claimed in claim 3, characterized in that the d.c. gate biasing voltage $V_{GS}=V_1$ is adjustable in the range where the transistor has a negative drain conductance zone in order to adjust the output power of the oscillator.

5. A device as claimed in any one of the claims 3 or 4, characterized in that the capacitance C of the L-C circuit is of a type which is variable as a function of a d.c. voltage $V_2$, for example a varicap, in order to enable adjustment of the operating frequency of the oscillator.

6. A device as claimed in any of the claims 1 to 4, in which the insulated-gate field effect transistor is of a type in which the gate is insulated from the channel by an oxide layer.

7. A device as claimed in any one of the claims 1 to 4, in which the insulating layer of the gate forms a heterostructure with the layer forming the channel of the insulated-gate field effect transistor.

8. A device as claimed in claim 7, characterized in that the gate of the insulated-gate field effect transistor is metallic.

9. A device as claimed in claim 7, characterized in that the gate of the insulated-gate field effect transistor is made of a semiconductor material.

10. A device as claimed in claim 7, in which the substrate of the insulated-gate field effect transistor comprises a semi-insulating material.

11. A device as claimed in claim 7, in which the substrate of the insulated-gate field effect transistor comprises a doped semiconductor material.

12. A device as claimed in claim 8, in which the substrate of the insulated-gate field effect transistor comprises a semi-insulating material.

13. A device as claimed in claim 9, in which the substrate of the insulated-gate field effect transistor comprises a semi-insulating material.

14. A device as claimed in claim 8, in which the substrate of the insulated-gate field effect transistor comprises a doped semiconductor material.

15. A device as claimed in claim 9, in which the substrate of the insulated-gate field effect transistor comprises a doped semiconductor material.

16. A device as claimed in claim 5, in which the insulated-gate field effect transistor is of a type in which the gate is insulated from the channel by an oxide layer.

17. A device as claimed in claim 5, in which the insulating layer of the gate forms a heterostructure with the layer forming the channel of the insulated-gate field effect transistor.

* * * * *